(12) United States Patent
Wang et al.

(10) Patent No.: US 9,667,274 B2
(45) Date of Patent: May 30, 2017

(54) METHOD OF CONSTRUCTING A PARITY-CHECK MATRIX FOR USING MESSAGE-PASSING ALGORITHM TO DECODE THE REPEAT-ACCUMULATE TYPE OF MODULATION AND CODING SCHEMES

(71) Applicant: Telefonaktiebolaget L M Ericsson (publ), Stockholm (SE)

(72) Inventors: Yi-Pin Eric Wang, Fremont, CA (US); Bo Hagerman, Tyresö (SE); Ali S. Khayrallah, Mountain View, CA (US); Michael Samuel Bebawy, Santa Clara, CA (US); Leif Wilhelmsson, Dalby (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 14 days.

(21) Appl. No.: 14/663,151

(22) Filed: Mar. 19, 2015

(65) Prior Publication Data

US 2016/0277036 A1 Sep. 22, 2016

(51) Int. Cl.
*H03M 13/00* (2006.01)
*H03M 13/11* (2006.01)
*H04L 1/00* (2006.01)

(52) U.S. Cl.
CPC ...... *H03M 13/118* (2013.01); *H03M 13/1197* (2013.01); *H03M 13/616* (2013.01); *H03M 13/6325* (2013.01); *H04L 1/0041* (2013.01)

(58) Field of Classification Search
CPC .. H03M 13/118; H03M 13/616; H04L 1/0041
See application file for complete search history.

(56) References Cited

U.S. PATENT DOCUMENTS 7,000,174 B2 * 2/2006 Mantha ............. H03M 13/1102
714/748
7,405,678 B2 * 7/2008 Cherubini ............. H03M 7/46
341/50

(Continued)

FOREIGN PATENT DOCUMENTS

| CN | 101610229 | 12/2009 |
| EP | 2 639 962 A1 | 9/2013 |
| WO | WO 2016/007061 A1 | 1/2016 |

OTHER PUBLICATIONS

Dariush Divsalar, et al., "*Coding Theorems for "Turbo-Like" Codes*", Jet Propulsion Laboratory and California Institute of Technology, https://www.scribd.com/document/144682680/Allerton-98, 10 pages, 1998.

(Continued)

*Primary Examiner* — Esaw Abraham
(74) *Attorney, Agent, or Firm* — Baker Botts, LLP

(57) ABSTRACT

A method in a network node comprises generating a parity-check matrix for decoding a transmission scheme. The transmission scheme comprises a repetition code, an interleaver, and a modulation having a memory property. The parity-check matrix comprises a function of: a differentiator matrix, the differentiator matrix comprising an inverse of an accumulator matrix; a deinterleaver matrix, the deinterleaver matrix comprising an inverse of an interleaver matrix, the interleaver matrix comprising a square unitary permutation matrix for introducing randomness; and a repetition decoder matrix.

36 Claims, 11 Drawing Sheets

(56) References Cited

U.S. PATENT DOCUMENTS

| | | | | |
|---|---|---|---|---|
| 7,430,257 | B1* | 9/2008 | Shattil | H04B 1/707 342/367 |
| 7,783,952 | B2* | 8/2010 | Nimbalker | H03M 13/114 714/755 |
| 7,965,761 | B2* | 6/2011 | Shattil | H04B 1/7174 375/147 |
| 8,019,020 | B1* | 9/2011 | Chaichanavong | H03M 13/1114 370/467 |
| 8,312,344 | B2* | 11/2012 | Myung | H03M 13/1185 714/752 |
| 8,473,823 | B2* | 6/2013 | Okamura | H03M 13/1102 714/758 |
| 8,595,590 | B1* | 11/2013 | Vojcic | H04L 1/0041 375/262 |
| 8,719,686 | B2* | 5/2014 | Chen | H03M 13/1111 714/810 |
| 8,943,383 | B2* | 1/2015 | Vojcic | H04L 1/0041 714/755 |
| 9,130,814 | B2* | 9/2015 | Petrov | H04L 1/007 |

OTHER PUBLICATIONS

L. R. Bahl et al., "*Optimal Decoding of Linear Codes for Minimizing Symbol Error Rate*", presented at the 1972 International Symposium on Information Theory, Asilomar, California, IEEE Transactions on Information Theory, pp. 284-287, Mar. 1974.

Hongwei Kong and Ed Shwedyk, "*On Channel Estimation and Sequence Detection of Interleaved Coded Signals over Frequency Nonselective Rayleigh Fading Channels*", IEEE Transactions on Vehicular Technology, vol. 47, No. 2, pp. 558-565, May 1998.

Oh, Mi-Kyung, et al., "*Iterative Channel Estimation and LDPC Decoding With Encoded Pilots*", IEEE Transactions on Vehicular Technology, vol. 57, No. 1, pp. 273-285, Jan. 2008.

Bao, Jianrong, et al., "*Concatenated eIRA Codes for Tamed Frequency Modulation*", IEEE 978-1-4244-2075-9/08, pp. 1886-1891, 2008.

Bonello, Nicholas, et al. "*On the Design of Pilot Symbol Assisted Codes*", IEEE 978-1-4244-2515-0/09, 5 pages, 2009.

Bao, Jianrong, et al., "*Design of Efficient Joint eIRA-Coded MSK Modulation Systems for Space Communications*", IEEE Transactions on Aerospace and Electronic Systems, vol. 48, No. 2, pp. 1636-1642, Apr. 2012.

Benaddi, Tarik, "*Design of Systematic GIRA Codes for CPM*", 2014 8th International Symposium on Turbo Codes and Iterative Information Processing (ISTC), IEEE 978-1-4799-5985-3/14, pp. 7-11, 2014.

Patent Cooperation Treaty, PCT, Notification of Transmittal of the International Search Report and the Written Opinion of the International Searching Authority, or the Declaration, International Application No. PCT/IB2016/050178, 16 pages, Apr. 5, 2016.

\* cited by examiner

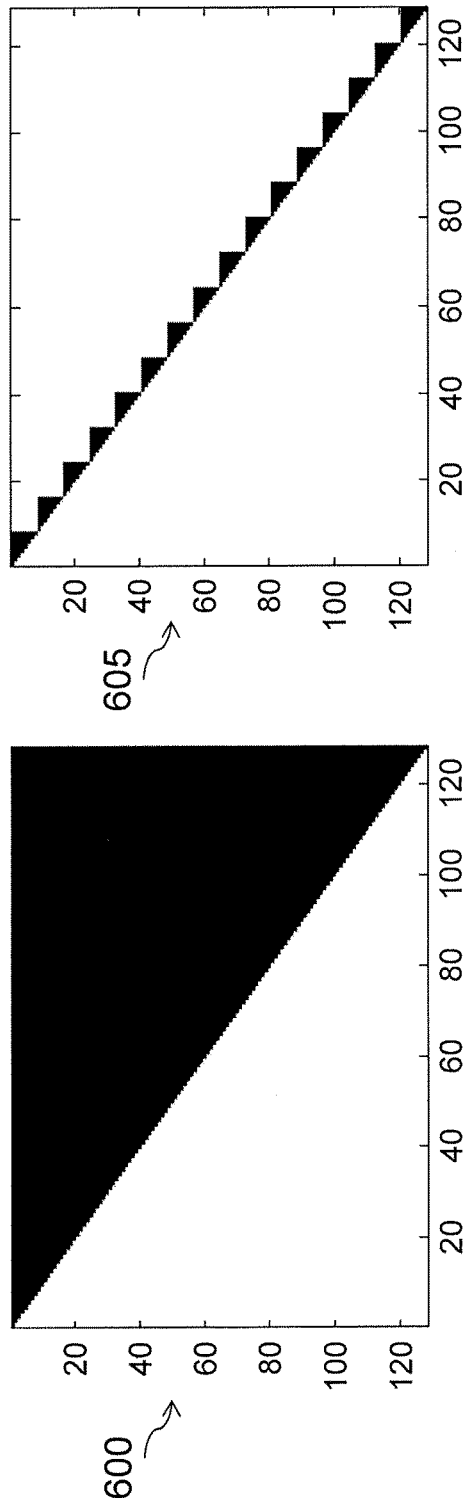
Figure 6B — A matrix for RA code with distributed pilots
Figure 6A — A matrix for original RA code (no pilots)

METHOD OF CONSTRUCTING A PARITY-CHECK MATRIX FOR USING MESSAGE-PASSING ALGORITHM TO DECODE THE REPEAT-ACCUMULATE TYPE OF MODULATION AND CODING SCHEMES

TECHNICAL FIELD

The present disclosure relates, in general, to wireless communications, and, more particularly, to constructing a parity-check matrix for using message-passing algorithm to decode the repeat-accumulate type of modulation and coding schemes.

BACKGROUND

In wireless communication systems, several radio impairments can endanger reliable reception of information bits. These impairments may include additive thermal noise, interference, multipath propagation, frequency offset and quantization noise. In order to combat these impairments and provide enough protection to transmitted information, channel coding is an indispensable tool. Over the past seven decades, a very thorough and detailed theory has been developed around channel coding, elaborating over a vast range of codes that provide a variety of encoding and decoding complexities, performance that approaches or backs away from theoretical bounds, as well as many other desirable properties. The greatest challenge in coding theory is the complexity-performance trade-off. On the one hand, sufficient structure must be embedded in the code in order to be exploited in simplifying the encoding and decoding complexities. On the other hand, it is a known fact from coding theory that two important ingredients for superior performance are randomness and large codeword lengths. Two pioneering works that managed to reconcile these two contradictory requirements were turbo codes and low-density parity-check (LDPC) codes.

Turbo codes introduce structure by utilizing simple component codes like convolutional or block codes that have simple encoding and decoding complexities, while randomness is introduced by using an interleaver. The decoding is performed in an iterative way by exchanging extrinsic probabilities on coded bits, usually in the form of log-likelihood ratios (LLR). LDPC codes are a certain class of linear block codes that are characterized by having a parity-check matrix with a low-density of ones. In LDPC codes, both structure and randomness are introduced in the design of the parity-check matrix. Decoding of LDPC codes is done via the message-passing algorithm (also called the sum-product algorithm), which exchanges messages between two sets of nodes in a bi-partite graph. Encoding of LDPC codes usually does not depend on the generator matrix, either because it is not easy to determine or because the encoding complexity will still be high. Thus, LDPC codes resort to alternative techniques to do the encoding.

One class of LDPC codes is repeat-accumulate (RA) codes. RA codes have simple encoding, and good performance at low coding rates. The encoding of RA codes consists of three steps: 1) repetition encoder; 2) interleave (to introduce randomness); and 3) accumulator (1/(1+D)). Using these features, an overall generator matrix of the RA code may be determined. A parity-check matrix of such an RA code can be generated using this information. The parity-check matrix for such an RA code can be thought of as the inverse operation of the three steps mentioned above, in reverse order: 1) differentiator (1−D) to undo accumulator; 2) deinterleaver; and 3) repetition decoder. Knowing the parity-check matrix makes decoding of the RA code using message-passing decoding possible. RA codes could also be thought of as a special kind of turbo code, with the outer component code being a repetition code, and the inner component code being a rate-1 convolutional code with a two-state trellis. This makes turbo decoding also possible.

In some wireless scenarios, the modulation technique of choice inherently has the accumulative property described above. For example, differential binary phase shift keying (D-BPSK) or certain kinds of continuous-phase frequency shift keying (CP-FSK), such as Gaussian FSK (GFSK), inherently have the accumulative property. These modulation techniques have desirable properties, such as constant-envelope and a relatively compact spectrum. They also perform well with a non-coherent demodulator when channel state information is not available.

If a transmitter uses a repetition code and an interleaver in conjunction with a modulation technique having the accumulator property, the resulting scheme becomes equivalent to an RA code, which lends itself naturally to turbo decoding. Turbo decoding yields superior performance and very low complexity, since the component code decoders are rather simple: repetition decoder and two-state BCJR algorithm. For transmission schemes involving a repetition code, an interleaver, and a modulation with memory such as DBPSK or some kind of CP-FSK such as GFSK, existing solutions in receivers rely on turbo decoders that exchange extrinsic LLRs between component decoders. The component encoders may include a repetition code decoder and a two-state trellis-based Log-MAP or Max-Log algorithm (an exact Log-MAP is called the BCJR algorithm). Although this offers good performance, the decoding latency could be high because every iteration of a trellis decoder has to be done sequentially in time, i.e., decoding steps cannot be done in parallel to save time. If the decoding requires several iterations between the trellis decoder and the repetition decoder to converge to the required performance, the culminating decoding latency could be high.

In principle, message-passing decoding has very comparable complexity (in terms of the required number of operations) to a turbo decoder, and has certain advantages. For example, message-passing decoding parallelizes the processing compared to a turbo decoder, which executes steps sequentially in time. Thus, message-passing decoding allows processing to be done in parallel, resulting in a reduction in the decoding time. In certain cases, however, a transmission scheme may have distributed pilots inserted in between the data sub-blocks. For example, distributed pilots may be inserted to assist in frequency tracking, channel estimation or modulation index correction. In such a case, caution has to be taken when dealing with certain transmission schemes as an RA code, because the accumulation property is interrupted and reset at the end of each data sub-block. The introduction of distributed pilots may cause difficulty in applying the message-passing algorithm to decode the transmission scheme. Thus, there is a need for a method of applying message-passing decoding to transmission schemes having distributed pilots.

SUMMARY

To address the foregoing problems with existing solutions, disclosed is a method in a network node. The method comprises generating a parity-check matrix for decoding a transmission scheme. The transmission scheme comprises a repetition code, an interleaver, and a modulation having a memory property. The parity-check matrix comprises a function of: a differentiator matrix, the differentiator matrix comprising an inverse of an accumulator matrix; a deinterleaver matrix, the deinterleaver matrix comprising an inverse of an interleaver matrix, the interleaver matrix comprising a square unitary permutation matrix for introducing randomness; and a repetition decoder matrix.

In certain embodiments, the method further comprises performing message-passing decoding using the generated parity-check matrix. The parity-check matrix may comprise any suitable function of the differentiator matrix, the deinterleaver matrix, and the repetition decoder matrix. As one example, the parity-check matrix may comprise a product of the differentiator matrix, the deinterleaver matrix, and the repetition decoder matrix. The modulation may comprise one of differential binary phase-shift keying (DBPSK), Gaussian frequency-shift keying (FSK), and Gaussian minimum shift keying. The transmission scheme may be a repeat-accumulate code. The repetition code may repeat each incoming bit according to a predetermined sequence pattern.

In certain embodiments, the accumulator matrix may be an upper triangular matrix having a diagonal and an upper triangle populated with ones and a lower triangle populated with zeroes. The transmission scheme may comprise a distributed pilot scheme having distributed pilot symbols between data sub-blocks. The accumulator matrix may be defined to account for an interruption of accumulation due to the distributed pilot symbols between data sub-blocks, such that the accumulator matrix is a block diagonal matrix having non-zero block matrices in a diagonal and all-zero matrices off-diagonal, each block matrix in the diagonal comprising an upper triangular matrix. The modulation may comprise a type of continuous-phase frequency-shift keying, and the method may further comprise performing de-rotation to convert the modulation scheme to differential binary phase-shift keying. Generating the parity-check matrix with the accumulator matrix defined to account for the interruption of accumulation due to the distributed pilot symbols may result in a lower density of ones in the parity-check matrix relative to a parity-check matrix generated with an accumulator matrix not accounting for the distributed pilot symbols.

Also disclosed is a network node. The network node comprises one or more processors. The one or more processors are configured to generate a parity-check matrix for decoding a transmission scheme. The transmission scheme comprises a repetition code, an interleaver, and a modulation having a memory property. The parity-check matrix comprises a function of: a differentiator matrix, the differentiator matrix comprising an inverse of an accumulator matrix; a deinterleaver matrix, the deinterleaver matrix comprising an inverse of an interleaver matrix, the interleaver matrix comprising a square unitary permutation matrix for introducing randomness; and a repetition decoder matrix.

Also disclosed is a method in a wireless device. The method comprises generating a parity-check matrix for decoding a transmission scheme. The transmission scheme comprises a repetition code, an interleaver, and a modulation having a memory property. The parity-check matrix comprises a function of: a differentiator matrix, the differentiator matrix comprising an inverse of an accumulator matrix; a deinterleaver matrix, the deinterleaver matrix comprising an inverse of an interleaver matrix, the interleaver matrix comprising a square unitary permutation matrix for introducing randomness; and a repetition decoder matrix.

In certain embodiments, the method further comprises performing message-passing decoding using the generated parity-check matrix. The parity-check matrix may comprise any suitable function of the differentiator matrix, the deinterleaver matrix, and the repetition decoder matrix. As one example, the parity-check matrix may comprise a product of the differentiator matrix, the deinterleaver matrix, and the repetition decoder matrix. The modulation may comprise one of differential binary phase-shift keying (DBPSK), Gaussian frequency-shift keying (FSK), and Gaussian minimum shift keying. The transmission scheme may be a repeat-accumulate code. The repetition code may repeat each incoming bit according to a predetermined sequence pattern.

In certain embodiments, the accumulator matrix may be an upper triangular matrix having a diagonal and an upper triangle populated with ones and a lower triangle populated with zeroes. The transmission scheme may comprise a distributed pilot scheme having distributed pilot symbols between data sub-blocks. The accumulator matrix may be defined to account for an interruption of accumulation due to the distributed pilot symbols between data sub-blocks, such that the accumulator matrix is a block diagonal matrix having non-zero block matrices in a diagonal and all-zero matrices off-diagonal, each block matrix in the diagonal comprising an upper triangular matrix. The modulation may comprise a type of continuous-phase frequency-shift keying, and the method may further comprise performing de-rotation to convert the modulation scheme to differential binary phase-shift keying. Generating the parity-check matrix with the accumulator matrix defined to account for the interruption of accumulation due to the distributed pilot symbols may result in a lower density of ones in the parity-check matrix relative to a parity-check matrix generated with an accumulator matrix not accounting for the distributed pilot symbols.

Also disclosed is a wireless device. The wireless device comprises one or more processors. The one or more processors are configured to generate a parity-check matrix for decoding a transmission scheme. The transmission scheme comprises a repetition code, an interleaver, and a modulation having a memory property. The parity-check matrix comprises a function of: a differentiator matrix, the differentiator matrix comprising an inverse of an accumulator matrix; a deinterleaver matrix, the deinterleaver matrix comprising an inverse of an interleaver matrix, the interleaver matrix comprising a square unitary permutation matrix for introducing randomness; and a repetition decoder matrix.

Certain embodiments of the present disclosure may provide one or more technical advantages. For example, certain embodiments may allow the message-passing algorithm to be applied to a variety of modulation techniques that have the memory (accumulator) property and inserted distributed pilot symbols. As another example, in certain embodiments the decoding latency may be reduced since the message-passing algorithm allows the execution of many steps in parallel. As another example, the messages sent from all the variable nodes to the check nodes in the bi-partite graph of the message-passing algorithm may be done simultaneously, and similarly for the messages sent from all the check nodes to the variable nodes. As yet another example, in certain embodiments performance can be traded off for latency by controlling the number of message-passing iterations during the decoding process. Other advantages of the present disclosure may be apparent to one of ordinary skill of the art. Certain embodiments may have none, some, or all of the recited advantages.

BRIEF DESCRIPTION OF THE DRAWINGS

For a more complete understanding of the disclosed embodiments and their features and advantages, reference is now made to the following description, taken in conjunction with the accompanying drawings, in which:

FIG. 6A illustrates a graphical representation of an accumulator matrix for an RA code without distributed pilots, in accordance with certain embodiments;

FIG. 6B illustrates a graphical representation of an accumulator matrix for an RA code with distributed pilots, in accordance with certain embodiments;

DETAILED DESCRIPTION

As described above, the message-passing algorithm offers a number of advantages compared to other decoding techniques. Where the transmission scheme involved has distributed pilot symbols, however, application of the message-passing algorithm may be problematic. Thus, there is a need for a method that allows the message-passing algorithm to be applied to a transmission scheme having distributed pilot symbols. The present disclosure contemplates various embodiments that may allow application of the message-passing algorithm for decoding transmission schemes having a concatenation of a repetition code, an interleaver, and a modulation having a memory property used with a distributed pilot scheme.

In operation, a wireless signal encoded with a transmission scheme having distributed pilot symbols may be received by a receiver. In certain embodiments, a parity-check matrix may be generated. The parity-check matrix may be a function of a differentiator matrix, a deinterleaver matrix, and a repetition decoder matrix. The differentiator matrix may be the inverse of an accumulator matrix. In certain embodiments, the accumulator matrix (as well as its corresponding differentiator matrix) may be redefined to account for the interruption of the accumulation due to the distributed pilots. The differentiator matrix, together with a deinterleaver matrix and a repetition decoder matrix may then be used to determine the parity-check matrix. The resulting parity-check matrix makes message-passing algorithm decoding of the transmission scheme possible. Although certain embodiments may be described in terms of an RA code having distributed pilots, the present disclosure contemplates that the various embodiments may be applicable to any suitable transmission scheme, such as, for example, transmission schemes having a repetition code, an interleaver, and a modulation scheme with memory that has distributed pilots.

Figure 1:
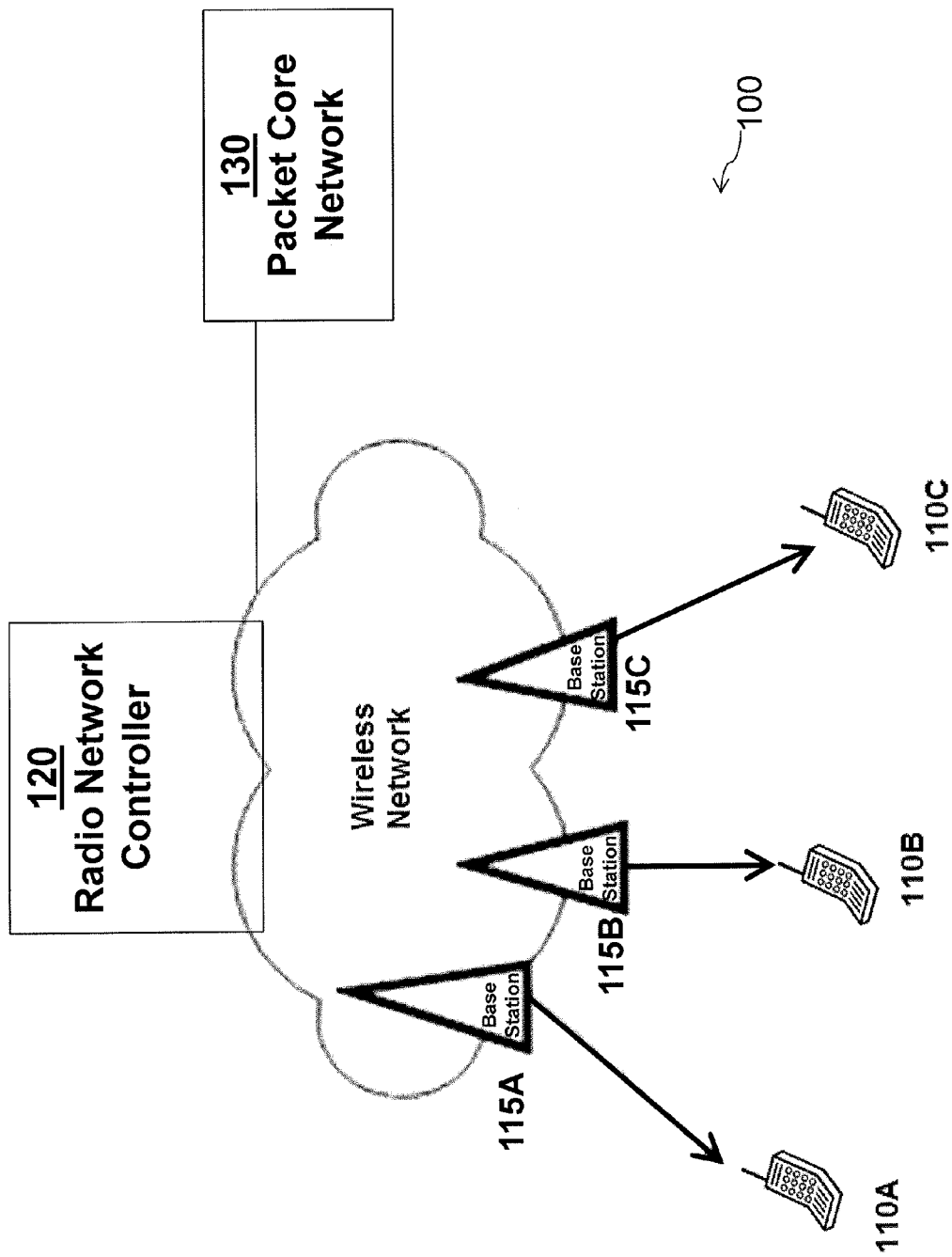
FIG. 1 is a block diagram illustrating an embodiment of a network, in accordance with certain embodiments.

FIG. 1 is a block diagram illustrating an embodiment of a network 100 that includes one or more wireless device(s) 110 (which may be interchangeably referred to as UEs 110), radio network node(s) 115 (which may be interchangeably referred to as eNBs 115), radio network controller(s) 120, and core network node(s) 130. A wireless device 110 may communicate with a radio network node 115 over a wireless interface. For example, wireless device 110 may transmit wireless signals to radio network node 115 and/or receive wireless signals from radio network node 115. In certain embodiments, a wireless device 110 may directly communicate with another wireless device 110. For example, wireless device 110A may directly communicate with wireless device 110B. The wireless signals may contain voice traffic, data traffic, control signals, and/or any other suitable information. The wireless signals may be encoded with any suitable transmission scheme. For example, the wireless signals may be encoded using an RA code or other transmission scheme equivalent to an RA code. In some embodiments, an area of wireless signal coverage associated with a radio network node 115 may be referred to as a cell.

Radio network node 115 may interface with radio network controller 120. Radio network controller 120 may control radio network node 115 and may provide certain radio resource management functions, mobility management functions, and/or other suitable functions. Radio network controller 120 may interface with core network node 130. In certain embodiments, radio network controller 120 may interface with core network node 130 via an interconnecting network. The interconnecting network may refer to any interconnecting system capable of transmitting audio, video, signals, data, messages, or any combination of the preceding.

In some embodiments, core network node 130 may manage the establishment of communication sessions and various other functionality for wireless device 110. Wireless device 110 may exchange certain signals with core network node 130 using the non-access stratum layer. In non-access stratum signaling, signals between wireless device 110 and core network node 130 may be transparently passed through the radio access network. Example embodiments of wireless device 110, radio network node 115, and other network nodes (such as radio network controller 120 or core network node 130) are described with respect to FIGS. 9, 10, and 11, respectively. Although FIG. 1 illustrates a particular arrangement of network 100, the present disclosure contemplates that the various embodiments described herein may be applied to networks having any suitable configuration. For example, network 100 may have any suitable number of wireless devices 110 and network nodes 115.

Figure 2:
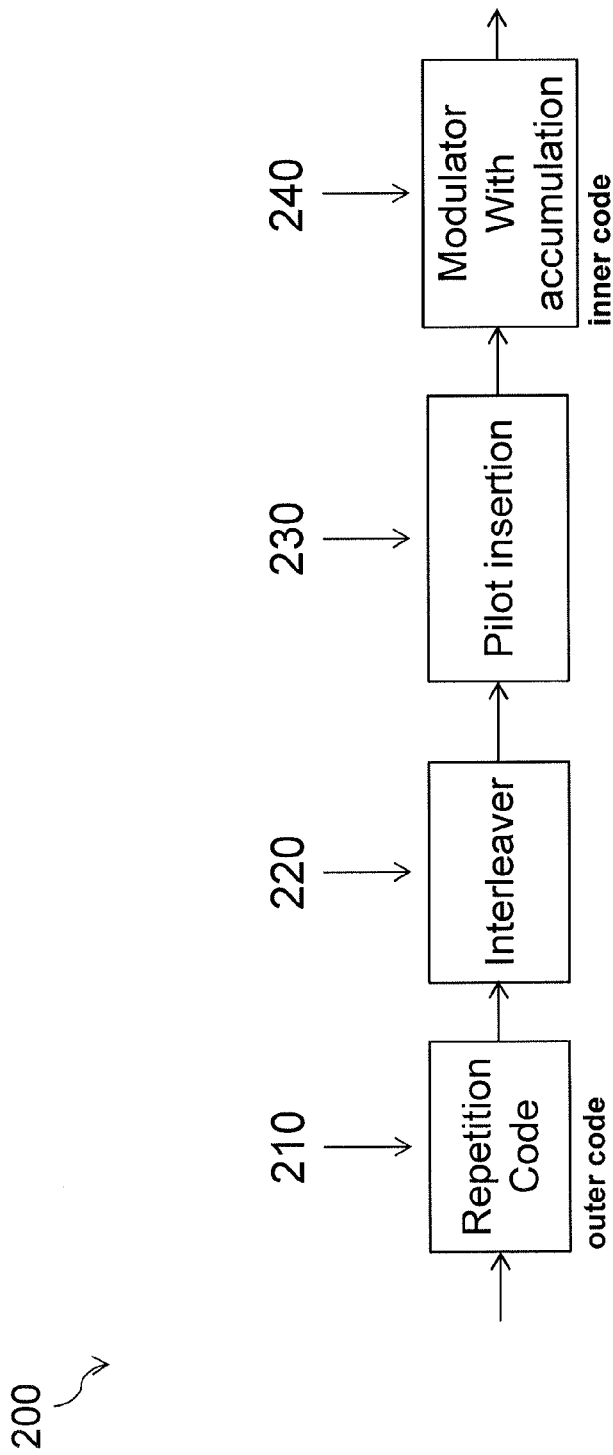
FIG. 2 illustrates a transmission scheme that results in the RA structure, in accordance with certain embodiments.

FIG. 2 illustrates a transmission scheme 200 that results in the RA code structure. Transmission scheme 200 includes repetition code 210, interleaver 220, pilot insertion 230, and modulator with accumulation 240. Modulator with accumulation 240 may be any suitable modulation scheme with memory. For example, modulator with accumulation 240 may be D-BPSK, GFSK, GMSK or any other suitable modulation type. From a coding point of view, transmission scheme 200 is called an RA code.

Figure 3:
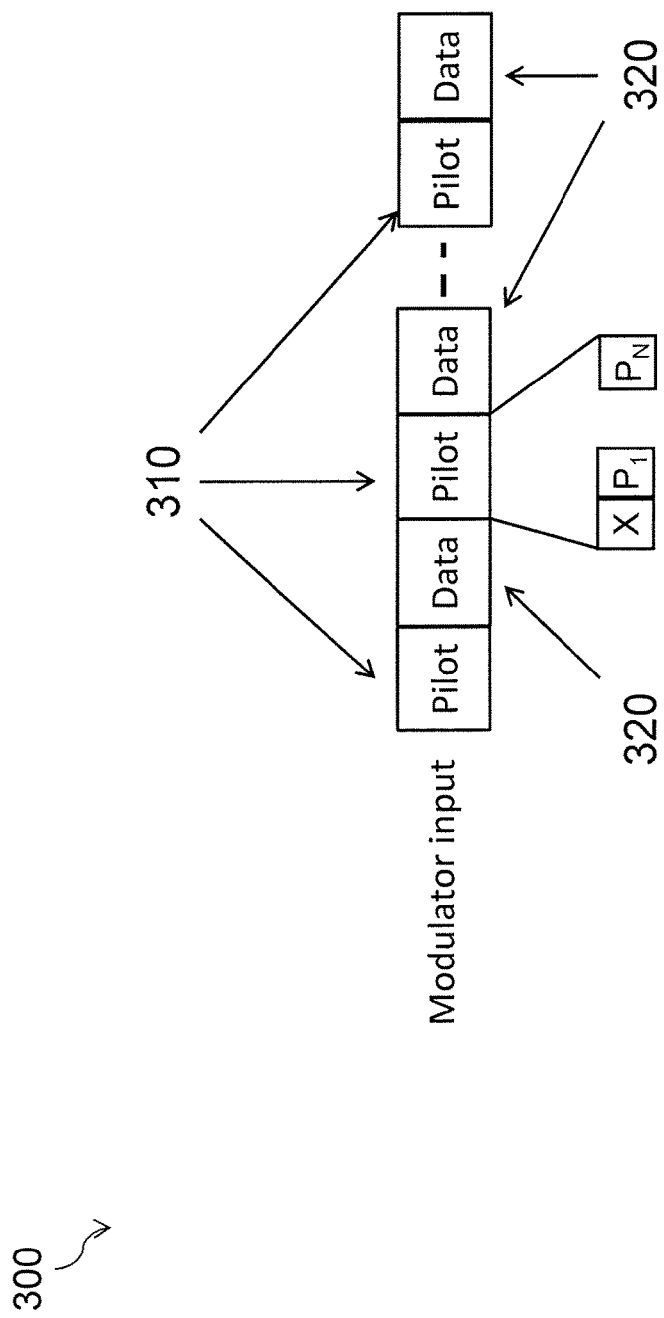
FIG. 3 illustrates the structure of a pilot sub-block that may be used in particular embodiments.

FIG. 3 illustrates the structure of a pilot sub-block that may be used in particular embodiments. More particularly, FIG. 3 illustrates a plurality of pilot-sub blocks 310 and data sub-blocks 320. The insertion of distributed pilots 310 between data sub-blocks 320 may be done for a variety of reasons. For example, distributed pilots may be inserted to assist in frequency tracking, channel estimation or modulation index correction. Inserted distributed pilot symbols 310 break the dependency between data sub-blocks 320. Thus, caution has to be taken when dealing with such a scheme as an RA code, because the accumulation property is interrupted and reset at the end of each data sub-block. The introduction of distributed pilots may cause difficulty in applying the message-passing algorithm to a transmission scheme.

In an arrangement such as the one shown in FIG. 3, the first pilot symbol may be chosen based on the data sub-block preceding it so that at the modulator output, the first pilot symbol is always 1. If the preceding data sub-block has symbols $d_1$ to $d_M \in \{1,-1\}$, then the first pilot symbol in the pilot sub-block is $\Pi_{i=1}^{M} d_i$. The subsequent pilot symbols can be set to any known fixed sequence that satisfy spectral and performance requirements. For example, the known fixed sequence may be an alternating sequence of 1's and −1's.

In certain embodiments, the framework at the receiver may be unified without having to define a new demodulator for each one of the modulation types mentioned earlier. CP-FSK modulations, such as GFSK and GMSK, with a modulation index of 0.5 are an example. Receive symbols can undergo a de-rotation step to be converted to D-BPSK. Afterwards, only one treatment is needed, that of D-BPSK. De-rotation may be performed in any suitable manner. For example, de-rotation may be performed in the following manner. If any kind of CP-FSK is used with a modulation index of 0.5, and the receive symbols are $\vec{x} = [x_1, x_2, \ldots, x_N]^T$, the input to the demodulator would be $$\left[x_1, x_2 \cdot e^{-i\frac{\pi}{2}}, x_3 \cdot e^{-i \cdot 2\frac{\pi}{2}}, \ldots, x_N \cdot e^{-i \cdot (N-1)\frac{\pi}{2}}\right]^T.$$

Note that some modulation types, like GFSK, are partial response. These modulation types incur a small amount of inter-symbol interference.

Figure 4:
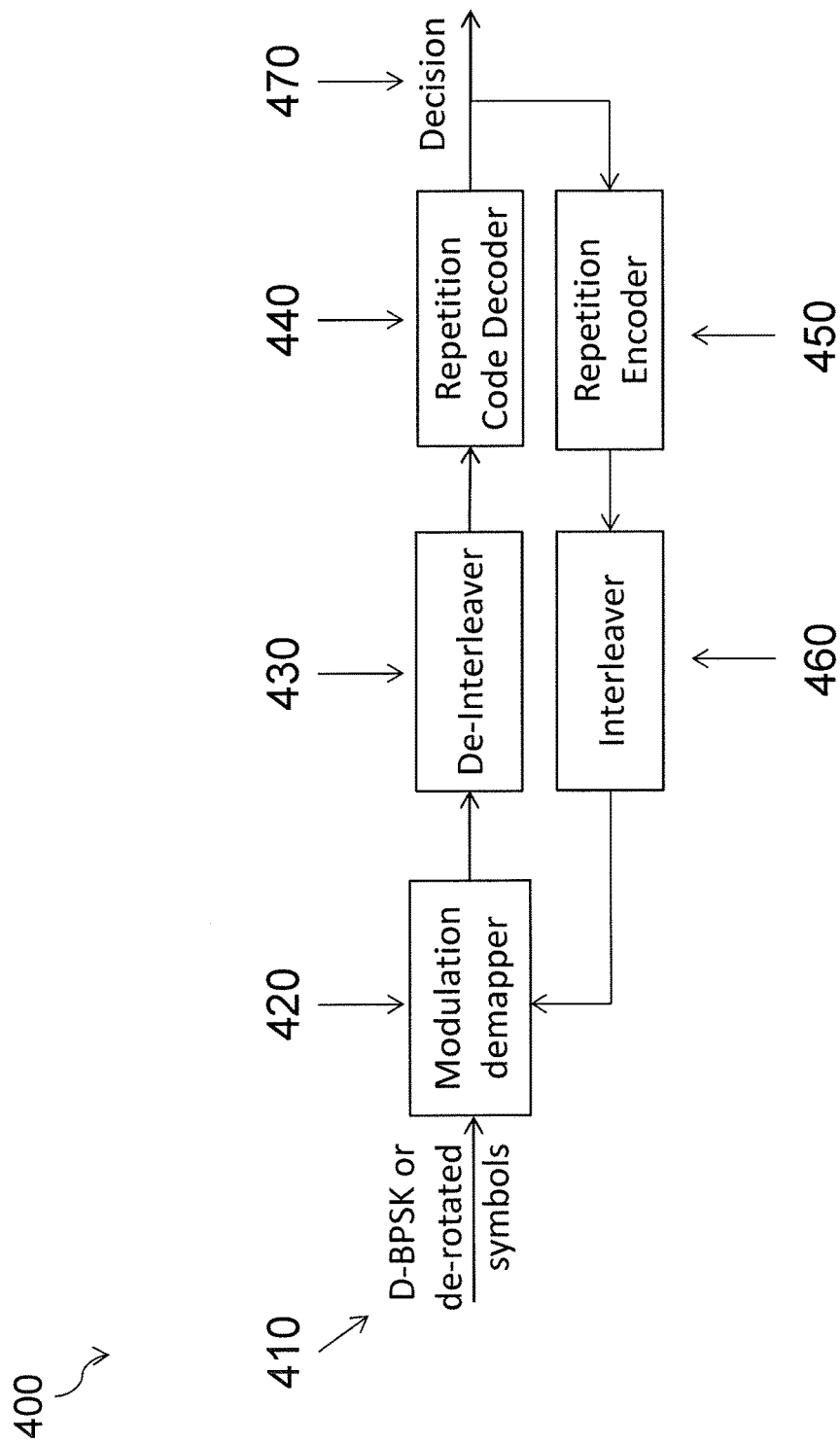
FIG. 4 illustrates the structure of a turbo receiver that may be used with respect to some embodiments.

FIG. 4 illustrates the structure of a turbo receiver 400 that may be used with respect to some embodiments. Turbo receiver 400 includes D-BPSK or de-rotated symbols 410, modulation demapper (demodulator) 420, de-interleaver 430, repetition code decoder 440, repetition encoder 450, interleaver 460, and decision 470. Turbo receiver 400 can be used to decode the aforementioned RA structure, such as transmission scheme 200 described above in relation to FIG. 2. The modulation demapper (i.e., demodulator) 420 may be an exact Log-MAP (BCJR) or an approximate Max-Log algorithm on a two-state trellis. Turbo decoder 400 may execute decoding steps sequentially, unlike the message-passing algorithm, which allows steps to be executed in parallel. The first pilot symbol in each pilot sub-block returns the trellis to the 1 state, so each data sub-block starts and ends at the same state. Thus, each data sub-block can be decoded independently from the rest of the receive burst. The turbo decoder may undergo an iterative process. During the decoding, the D-BPSK or de-rotated symbols 410 may pass through the elements of the turbo decoder multiple times before reaching decision 470 on the information contained therein.

In certain embodiments, instead of using a turbo decoder to decode the RA structure, the RA structure of the transmission scheme is treated as an LDPC code. Recall that LDPC codes are a class of block codes decoded using a parity-check matrix. In certain embodiments, the repeat accumulate structure may be decoded using an LDPC based approach. In other words, a parity-check matrix is generated to be used for LDPC coding, factoring in the repetition code, interleaver, and modulator property of the RA structure of the transmission scheme. Treating the RA code as an LDPC code and redefining certain variables of the parity-check matrix to account for distributed pilot symbols allows the message-passing algorithm to be applied to decode transmission schemes having distributed pilots.

Figure 5:
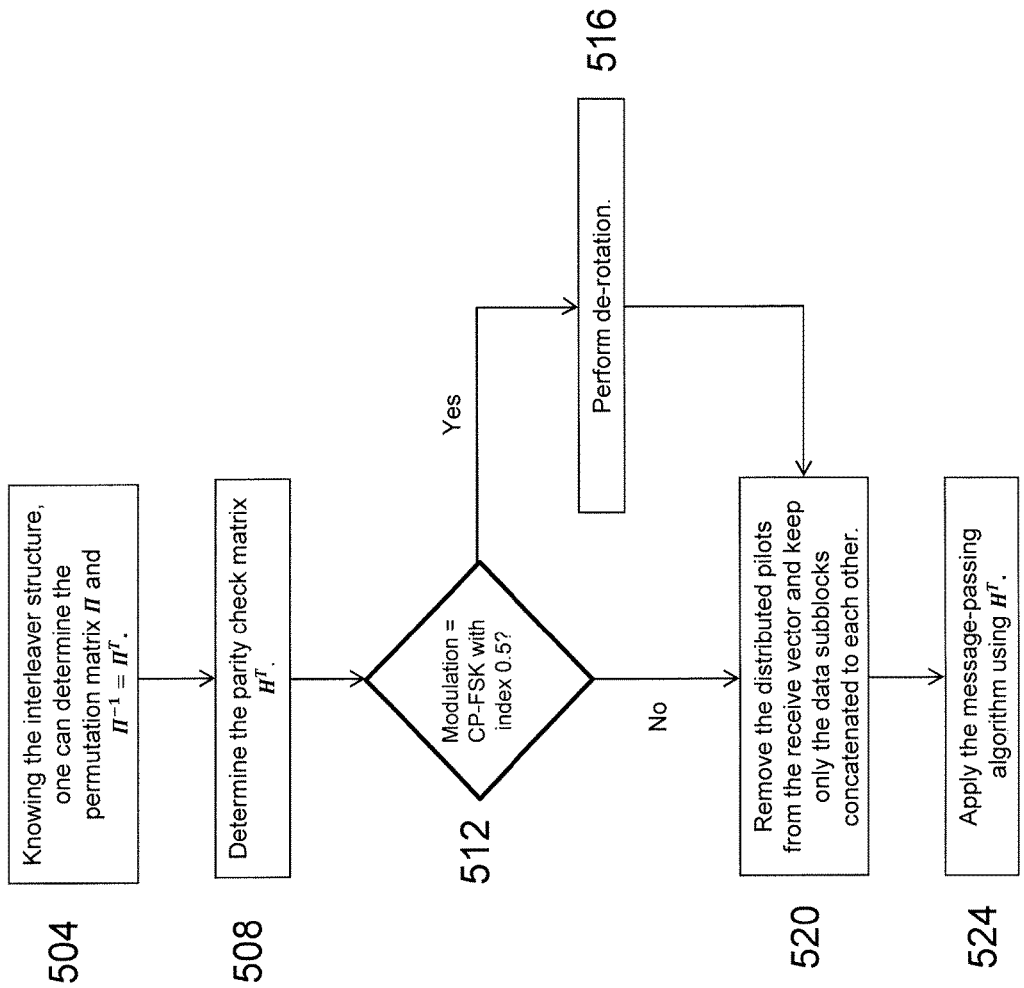
FIG. 5 is a flow diagram illustrating a method for decoding a transmission scheme, in accordance with an embodiment.

FIG. 5 is a flow diagram illustrating a method for decoding a transmission scheme, in accordance with an embodiment. In certain embodiments, the method may be performed in a network node. In certain embodiments, the method may be performed in a wireless device. The method begins at step 504, when, knowing the interleaver structure, permutation matrices $\Pi$ and $\Pi^{-1} = \Pi^T$ can be determined. Let $\Pi$ be the interleaver matrix. The interleaver matrix may be a square unitary permutation matrix. As described above, the interleaver matrix may be used to introduce randomness into an RA code. At step 508, the parity-check matrix $H^T$ is determined. The parity-check matrix may be the inverse operations of the matrices constituting an overall generator matrix, in reverse order. In certain embodiments, the overall generator matrix may be defined as:

$$G = G_R \cdot \Pi \cdot A, \quad (1)$$

where $G_R$ is a generator matrix, $\Pi$ is the interleaver matrix, and A is an accumulator matrix.

In certain embodiments, the parity-check matrix is given as a function of three matrices: a differentiator matrix, a deinterleaver matrix, and a repetition decoder matrix. The present disclosure contemplates that the parity-check matrix may be any suitable function of the differentiator matrix, the deinterleaver matrix, and the repetition decoder matrix. For example, in certain embodiments, the parity-check matrix may be the product of the differentiator matrix, the deinterleaver matrix, and the repetition decoder matrix. In such a case, the parity-check matrix $H^T$ may be defined as:

$$H^T = A^{-1} \cdot \Pi^{-1} \cdot H_R^T, \quad (2)$$

where $A^{-1}$ is the differentiator matrix (i.e., the inverse of the accumulator matrix A), $\Pi^{-1}$ is the deinterleaver matrix (i.e., the inverse of the interleaver matrix $\Pi$), and $H_R^T$ is the repetition decoder matrix. The superscript T represents the transpose of the matrix. The various matrices defining the generator matrix and the corresponding parity-check matrix are described in more detail below.

As described above, distributed pilots may be inserted in between data sub-blocks. Insertion of these pilot symbols may interrupt the accumulation property of a transmission scheme, causing it to be reset at the end of each data sub-block. This may cause problems with application of the message-passing algorithm. In certain embodiments, if the pilot symbols are removed, the generator matrix $G_R$ of the equivalent RA structure can be constructed as follows. If the code rate is $$\frac{1}{N_R},$$

and r=[1, 1, . . . , 1]$N_R$ times, then:

$$G_R = \begin{bmatrix} r & 0 & \cdots & 0 \\ 0 & r & \cdots & 0 \\ \vdots & \vdots & \ddots & \vdots \\ 0 & 0 & \cdots & r \end{bmatrix}.$$

In the above matrix, the number of rows of $G_R$ is equal to the number of uncoded information bits, $N_U$, and the number of columns is equal to $N_U \cdot N_R$.

In the overall generator matrix defined above in Equation (1), A is the accumulator matrix. Generally, in an RA code without distributed pilots, A would be an upper triangular matrix with a diagonal and upper triangle all populated with 1's, and a lower triangle populated with 0's. This type of accumulator matrix is illustrated in FIG. 6A and described in more detail below.

When distributed pilot symbols are included in the transmission scheme, problems may result if the accumulator matrix described above is used. Thus, in certain embodiments, the accumulator matrix A is redefined to account for the insertion of pilot symbols. When the accumulator matrix is redefined to account for insertion of distributed pilots, the resulting accumulator matrix A is a blockwise upper triangular matrix. A graphical representation of the redefined accumulator matrix is illustrated in FIG. 6B and described in more detail below. Let $A_U$ be a square upper triangular matrix of dimension $N_D$ equal to the length of one data block. Then, in the case of a transmission scheme having distributed pilots, the redefined accumulator matrix A is equal to:

$$A = \begin{bmatrix} A_U & 0 & \cdots & 0 \\ 0 & A_U & \cdots & 0 \\ \vdots & \vdots & \ddots & \vdots \\ 0 & 0 & \cdots & A_U \end{bmatrix}.$$

Given the uncoded information bit vector d, the coded data vector as seen at the output of the modulator with accumulation (without the distributed pilots) will be c=d·G mod 2.

As described above, the parity-check matrix corresponding to the overall generator matrix G may be a function of three matrices which are the inverse operations of the matrices constituting the overall generator matrix G in reverse order. For example, the parity-check matrix may be the product of the three matrices which are the inverse operations of the matrices constituting the overall generator matrix G in reverse order. More particularly, the parity-check matrix may be the product of a differentiator matrix, a deinterleaver matrix, and a repetition decoder matrix. Thus, the parity-check matrix may be defined as $H^T = A^{-1} \cdot \Pi^{-1} \cdot H_R^T$, where $A^{-1}$ is the differentiator matrix (i.e., the inverse of the accumulator matrix described above), $\Pi^{-1}$ is the deinterleaver matrix (i.e., the inverse of the interleaver matrix described above, and $H_R^T$ is the repetition decoder matrix, where the superscript T represents the transpose of the matrix.

As described above, the accumulator matrix A may be redefined to account for insertion of distributed pilot symbols. Redefining the accumulator matrix A results in corresponding changes to the differentiator matrix $A^{-1}$, which is the inverse of the accumulator matrix A. For example, given the redefined accumulator matrix A described above, the resulting differentiator matrix $A^{-1}$ may be defined as:

$$A^{-1} = \begin{bmatrix} A_U^{-1} & 0 & \cdots & 0 \\ 0 & A_U^{-1} & \cdots & 0 \\ \vdots & \vdots & \ddots & \vdots \\ 0 & 0 & \cdots & A_U^{-1} \end{bmatrix}, \text{ where}$$

$$A_U^{-1} = \begin{bmatrix} 1 & 1 & 0 & 0 \\ 0 & 1 & \ddots & 0 \\ 0 & 0 & \ddots & 1 \\ 0 & 0 & 0 & 1 \end{bmatrix}.$$

In addition to the differentiator matrix $A^{-1}$, the parity-check matrix is generated using the deinterleaver matrix $\Pi^{-1}$ and the repetition decoder matrix $H_R^T$. The deinterleaver matrix $\Pi^{-1}$ is defined as $\Pi^{-1} = \Pi^T$. The repetition decoder matrix is defined as:

$$H_R = \begin{bmatrix} H_{RS} & 0 & \cdots & 0 \\ 0 & H_{RS} & \cdots & 0 \\ \vdots & \vdots & \ddots & \vdots \\ 0 & 0 & \cdots & H_{RS} \end{bmatrix},$$

where $$H_{RS}^T = \begin{bmatrix} 1 & 1 & 1 & \cdots & 1 \\ 1 & 0 & 0 & \cdots & 0 \\ 0 & 1 & 0 & \cdots & 0 \\ \vdots & \vdots & \vdots & \ddots & \vdots \\ 0 & 0 & 0 & \cdots & 1 \end{bmatrix} = \begin{bmatrix} 1 \\ \mathbb{I} \end{bmatrix}.$$

In certain embodiments, redefining the accumulator matrix A to account for the inserted distributed pilot symbols may be advantageous in that it may reduce receiver complexity. For example, consider an existing approach for treating an RA code with distributed pilots as compared to certain embodiments disclosed herein. According to existing approaches for treating an RA code with distributed pilots, pilot symbols are included in the accumulator matrix A and the differentiator matrix $A^{-1}$. In such a case, the accumulator matrix A is upper triangular, and $A^{-1}$ is all zero except for the main diagonal and the one above it. Such an approach, however, requires the pilot symbols to be included in the LDPC decoding process. Including the pilot symbols in the LDPC decoding process gives rise to a higher dimensionality of the parity-check matrix, and thus high receiver complexity.

Figure 7B:
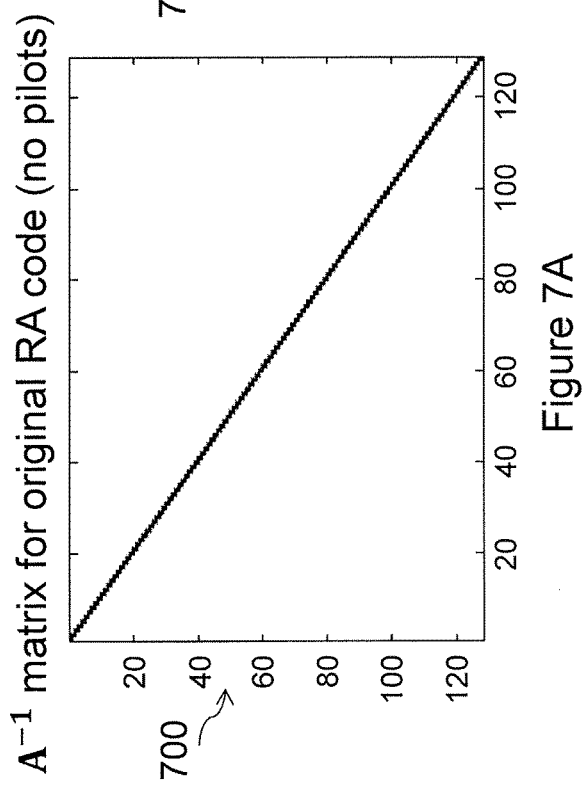
FIG. 7B illustrates a graphical representation of a differentiator matrix for an RA code with distributed pilots, in accordance with certain embodiments.

By comparison, in some of the embodiments described herein, the pilot symbols need not be included in the LDPC decoding process. Not including the pilot symbols in the LDPC decoding process may result in a significant reduction in the number of variable nodes and check nodes in LDPC decoding. Furthermore, in certain embodiments the redefined accumulator matrix A is a block-wise upper triangular matrix, and the corresponding differentiator matrix $A^{-1}$ is as shown in FIG. 7B. Thus, in comparison to the existing approach described above, in which the accumulator matrix A is upper triangular and the corresponding differentiator matrix $A^{-1}$ is all zero except for the main diagonal and the one above it, certain embodiments described herein result in a lower density of 1's in the parity-check matrix $H^T$. A lower density of 1's in the party-check matrix may be advantageous because it results lower receiver complexity.

Having determined the parity-check matrix $H^T$, the method proceeds to decision point 512, where it is determined whether or not the modulation of the transmission scheme being decoded is a CP-FSK type modulation with an index of 0.5. If it is determined that the modulation of the transmission scheme being decoded is a CP-FSK type modulation with an index of 0.5, the method proceeds to step 516, and de-rotation is performed. In certain embodiments, de-rotation may be performed as described above in relation to FIG. 3. For example, if the transmission scheme being decoded is a CP-FSK type modulation with an index of 0.5, such as one of GFSK and GMSK having a modulation index of 0.5, the receive symbols may undergo de-rotation, converting the receive symbols to D-BPSK. For transmissions schemes such as these, the receive symbols are $\vec{x}=[x_1, x_2, \ldots, x_N]^T$. Thus, the input to the demodulator would be $$[x_1, x_2 \cdot e^{-i\frac{\pi}{2}}, x_3 \cdot e^{-i \cdot 2 \cdot \frac{\pi}{2}}, \ldots, x_N \cdot e^{-i(N-1)\frac{\pi}{2}}]^T.$$

Once de-rotation is performed, the method proceeds to step 520. Alternatively, if it is determined that the transmission scheme is not a modulation type of CP-FSK with index 0.5, the method proceeds to step 520.

At step 520, the distributed pilots are removed from the receive vector. Only the data sub-blocks concatenated to each other are kept. At step 524, the message-passing algorithm may be applied using the parity-check matrix $H^T$ to decode the transmission scheme. Decoding a transmission scheme having distributed pilots using the message-passing algorithm may be advantageous in that it allows the processing to be done in parallel, unlike other decoding schemes that may require that processing be done sequentially in time. As a result, the time required to decode the transmission scheme may be reduced. Furthermore, the messages sent from all the variable nodes to the check nodes in the bi-partite graph of the message-passing algorithm may be done simultaneously, and similarly for the messages sent from all the check nodes to the variable nodes. In certain embodiments, performance can be traded off for latency by controlling the number of message-passing iterations during the decoding process.

FIG. 6A illustrates a graphical representation of an accumulator matrix 600 for an RA code without distributed pilots, in accordance with certain embodiments. As described above, an accumulator matrix is used to generate an overall generator matrix for an RA code. More particularly, the graphical representation of accumulator matrix 600 is an upper triangular matrix with the diagonal and the upper triangle all populated with 1's and the lower triangle with 0's.

FIG. 6B illustrates a graphical representation of an accumulator matrix 650 for an RA code with distributed pilots, in accordance with certain embodiments. As described above, in certain embodiments the accumulator matrix used for determining an overall generator matrix of an RA code may be redefined to take into account distributed pilots inserted between data sub-blocks. When the accumulator matrix is redefined to take account of distributed pilots, the graphical representation of accumulator matrix 650 becomes a block diagonal matrix, which has non-zero block matrices in the diagonal, and all-zero matrices off-diagonal. Furthermore, each block matrix in the diagonal is an upper triangular matrix. This is shown in FIG. 6B.

Figure 7A:
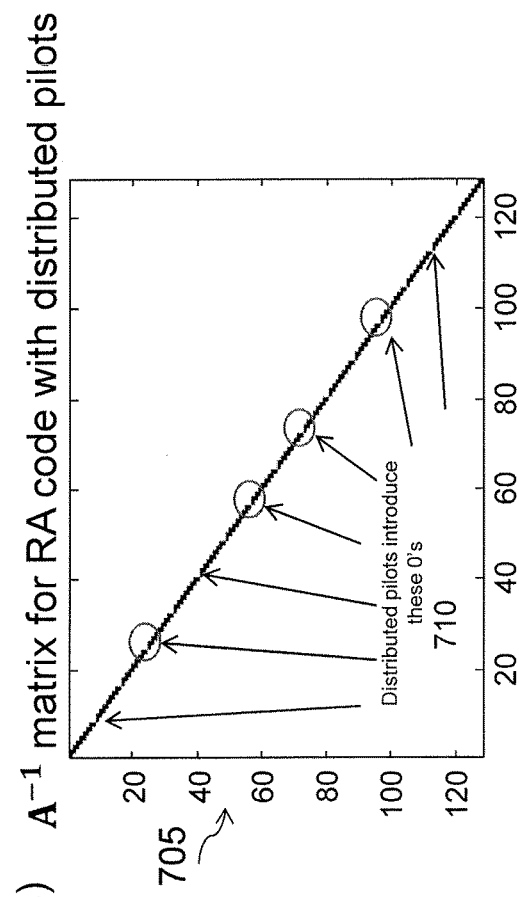
FIG. 7A illustrates a graphical representation of a differentiator matrix for an RA code without distributed pilots, in accordance with certain embodiments.

FIG. 7A illustrates a graphical representation of a differentiator matrix 700 for an RA code without distributed pilots, in accordance with certain embodiments. As described above, a differentiator matrix is used to generate a parity-check matrix, and may be the inverse of the accumulator matrix used to generate an overall generator matrix of an RA code. More particularly, FIG. 7A is a graphical representation of differentiator matrix 700 that is the inverse of accumulator matrix 600 described above in relation to FIG. 6A. In a transmission scheme where there are no distributed pilots, the resulting differentiator matrix 700 is all zero, except for the main diagonal and the diagonal above it.

FIG. 7B illustrates a graphical representation of a differentiator matrix 705 for an RA code with distributed pilots, in accordance with certain embodiments. As described above, a differentiator matrix is used to generate a parity-check matrix, and may be an inverse of the accumulator matrix used to generate an overall generator matrix of an RA code. More particularly, FIG. 7B is a graphical representation of differentiator matrix 705 that is the inverse of accumulator matrix 605 described above in relation to FIG. 6B. As described above, in certain embodiments the accumulator matrix is redefined to take into account distributed pilots. When the accumulator matrix is redefined to include the distributed pilots, the resulting differentiator matrix 705 has a lower density of 1's than the corresponding differentiator matrix 700 when distributed pilots are not included. The lower density of 1's is highlighted in FIG. 7B at points 710. Each point 710 represents an instance where the inclusion of the distributed pilots results in introduction of zeroes within differentiator matrix 705. The lower density of 1's in differentiator matrix 705 results in a lower density of 1's in the parity-check matrix, which advantageously results in a lower receiver complexity.

Figure 8:
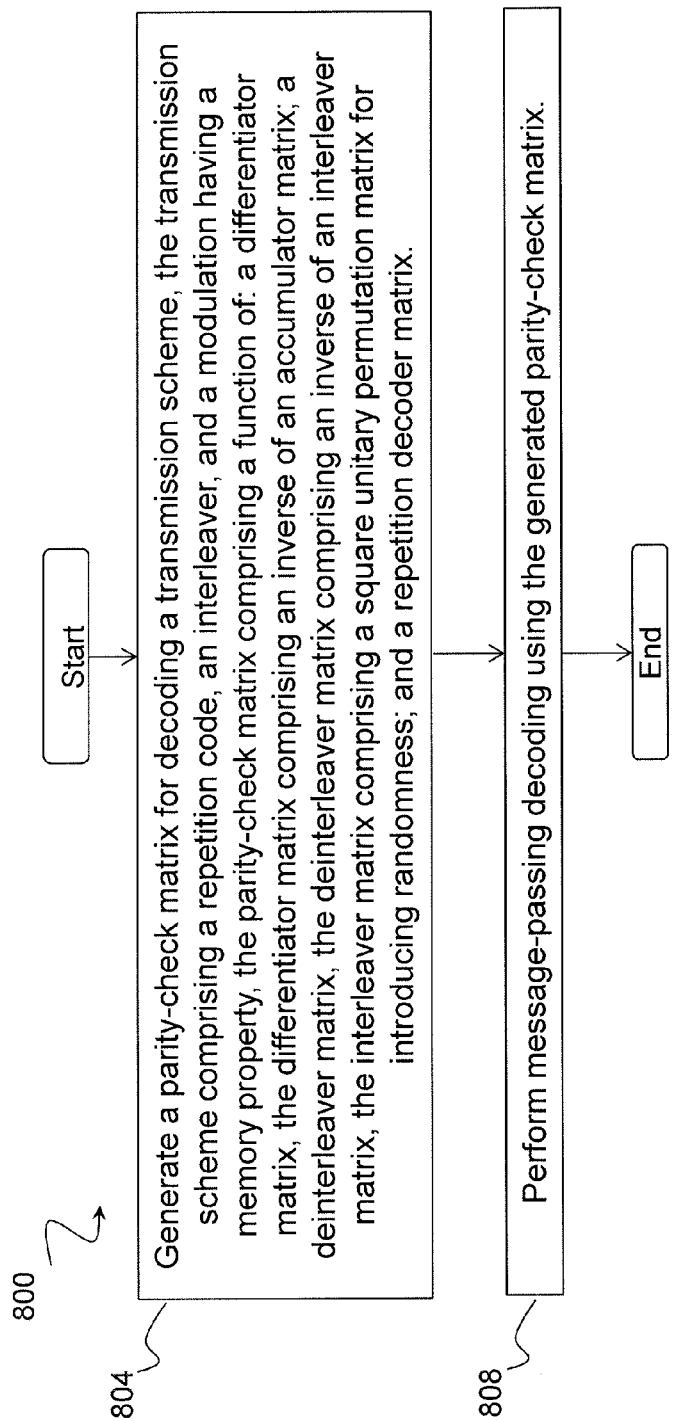
FIG. 8 is a flow diagram illustrating a method, in accordance with an embodiment.

FIG. 8 is a flow diagram illustrating a method, in accordance with an embodiment. In certain embodiments, the method may be performed by a network node. In certain embodiments, the method may be performed by a wireless device. The method begins at step 804, when a parity-check matrix for decoding a transmission scheme is generated. The transmission scheme comprises a repetition code, an interleaver, and a modulation having a memory property. The parity-check matrix comprises a function of: a differentiator matrix, the differentiator matrix comprising an inverse of an accumulator matrix; a deinterleaver matrix, the deinterleaver matrix comprising an inverse of an interleaver matrix, the interleaver matrix comprising a square unitary permutation matrix for introducing randomness; and a repetition decoder matrix.

In certain embodiments, the parity-check matrix may comprise any suitable function of the differentiator matrix, the deinterleaver matrix, and the repetition decoder matrix. As one example, the parity-check matrix may comprise a product of the differentiator matrix, the deinterleaver matrix, and the repetition decoder matrix. The modulation may comprise one of differential binary phase-shift keying (DBPSK), Gaussian frequency-shift keying (FSK), and Gaussian minimum shift keying. The transmission scheme may be a repeat-accumulate code. The repetition code may repeat each incoming bit according to a predetermined sequence pattern.

In certain embodiments, the repetition decoder may comprise an inverse of a generator matrix of the repetition code. The accumulator matrix may be an upper triangular matrix having a diagonal and an upper triangle populated with ones and a lower triangle populated with zeroes. The transmission scheme may comprise a distributed pilot scheme having distributed pilot symbols between data sub-blocks. The accumulator matrix may be defined to account for an interruption of accumulation due to the distributed pilot symbols between data sub-blocks, such that the accumulator matrix is a block diagonal matrix having non-zero block matrices in a diagonal and all-zero matrices off-diagonal, each block matrix in the diagonal comprising an upper triangular matrix.

At step 808, message-passing decoding is performed using the generated parity-check matrix. In certain embodiments, the modulation comprises a type of continuous-phase frequency-shift keying, and the method further comprises performing de-rotation to convert the modulation scheme to differential binary phase-shift keying. Generating the parity-check matrix with the accumulator matrix defined to account for the interruption of accumulation due to the distributed pilot symbols may result in a lower density of ones in the parity-check matrix relative to a parity-check matrix generated with an accumulator matrix not accounting for the distributed pilot symbols.

Figure 9:
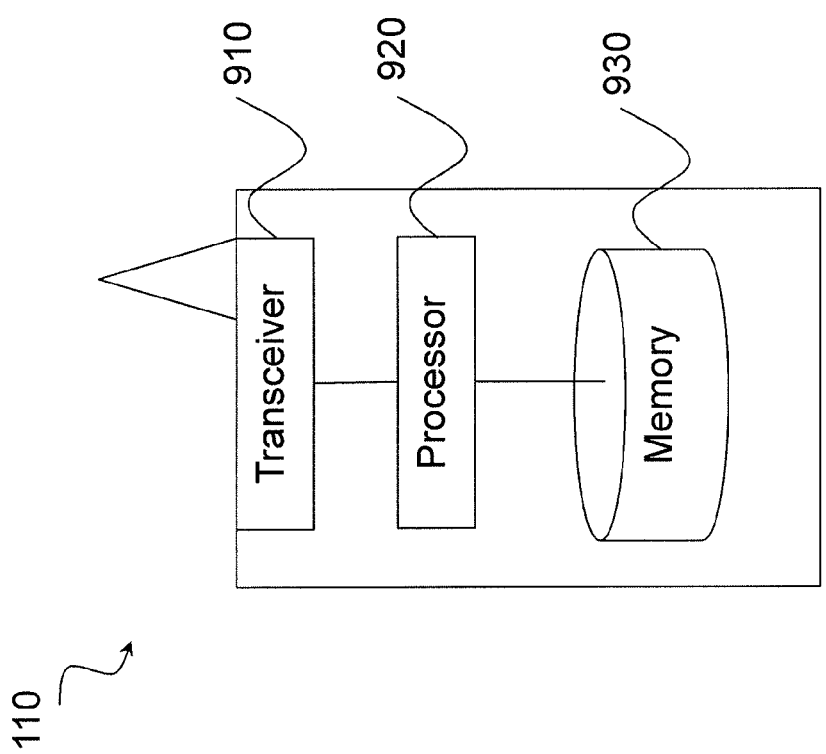
FIG. 9 is a block schematic of an exemplary wireless device, in accordance with certain embodiments.

FIG. 9 is a block schematic of an exemplary wireless device 110, in accordance with certain embodiments. Wireless device 110 may refer to any type of wireless device communicating with a node and/or with another wireless device in a cellular or mobile communication system. Examples of wireless device 110 include a mobile phone, a smart phone, a PDA (Personal Digital Assistant), a portable computer (e.g., laptop, tablet), a sensor, a modem, a machine type (MTC) device/machine to machine (M2M) device, laptop embedded equipment (LEE), laptop mounted equipment (LME), USB dongles, a device-to-device capable device, or another device that can provide wireless communication.

A wireless device 110 may also be referred to as a user equipment (UE), a station (STA), a device, or a terminal in some embodiments. Wireless device 110 includes transceiver 910, processor 920, and memory 930. In some embodiments, transceiver 910 facilitates transmitting wireless signals to and receiving wireless signals from network node 115 (e.g., via an antenna), processor 920 executes instructions to provide some or all of the functionality described above as being provided by wireless device 110, and memory 930 stores the instructions executed by processor 920.

Processor 920 may include any suitable combination of hardware and software implemented in one or more modules to execute instructions and manipulate data to perform some or all of the described functions of wireless device 110. In some embodiments, processor 920 may include, for example, one or more computers, one or more central processing units (CPUs), one or more microprocessors, one or more applications, and/or other logic. In certain embodiments, processor 920 may be configured to generate a parity-check matrix as described above, and perform message-passing decoding using the generated parity-check matrix.

Memory 930 is generally operable to store instructions, such as a computer program, software, an application including one or more of logic, rules, algorithms, code, tables, etc. and/or other instructions capable of being executed by a processor. Examples of memory 930 include computer memory (for example, Random Access Memory (RAM) or Read Only Memory (ROM)), mass storage media (for example, a hard disk), removable storage media (for example, a Compact Disk (CD) or a Digital Video Disk (DVD)), and/or or any other volatile or non-volatile, non-transitory computer-readable and/or computer-executable memory devices that store information.

Other embodiments of wireless device 110 may include additional components beyond those shown in FIG. 9 that may be responsible for providing certain aspects of the wireless device's functionality, including any of the functionality described above and/or any additional functionality (including any functionality necessary to support the solution described above).

In certain embodiments, wireless device 110 may include one or more modules. For example, wireless device 110 may include a determining module, a communication module, a receiver module, an input module, a display module, and any other suitable modules. The determining module may perform the processing functions of wireless device 110. For example, the determining module may generate a parity-check matrix for decoding a transmission scheme, such as a transmission scheme using an RA code. The determining module may perform message-passing decoding using the generated parity-check matrix. The determining module may include or be included in processor 920. The determining module may include analog and/or digital circuitry configured to perform any of the functions of the determining module and/or processor 920. The functions of the determining module described above may, in certain embodiments, be performed in one or more distinct modules.

The communication module may perform the transmission functions of wireless device 110. The communication module may transmit messages to one or more of network nodes 115 of network 100. The communication module may include a transmitter and/or a transceiver, such as transceiver 910. The communication module may include circuitry configured to wirelessly transmit messages and/or signals. In particular embodiments, the communication module may receive messages and/or signals for transmission from the determining module.

The receiving module may perform the receiving functions of wireless device 110. For example, the receiving module may receive a signal encoded using an RA code. The receiving module may include a receiver and/or a transceiver. The receiving module may include circuitry configured to wirelessly receive messages and/or signals. In particular embodiments, the receiving module may communicate received messages and/or signals to the determining module.

The input module may receive user input intended for wireless device 110. For example, the input module may receive key presses, button presses, touches, swipes, audio signals, video signals, and/or any other appropriate signals. The input module may include one or more keys, buttons, levers, switches, touchscreens, microphones, and/or cameras. The input module may communicate received signals to the determining module.

The display module may present signals on a display of wireless device 110. The display module may include the display and/or any appropriate circuitry and hardware configured to present signals on the display. The display module may receive signals to present on the display from the determining module.

Figure 10:
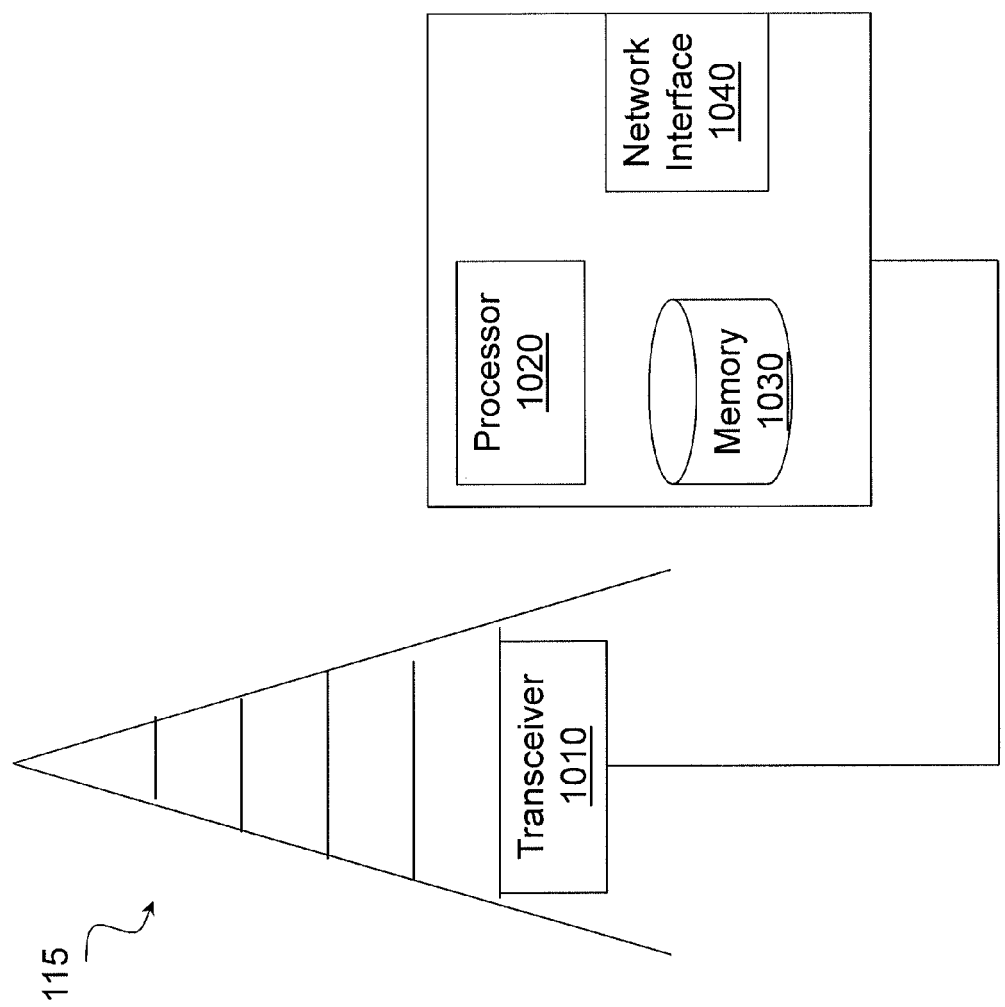
FIG. 10 is a block schematic of an exemplary network node, in accordance with certain embodiments.

FIG. 10 is a block schematic of an exemplary network node 115, in accordance with certain embodiments. Network node 115 may be any type of radio network node or any network node that communicates with a wireless device and/or with another network node. Examples of network node 115 include an eNodeB, a node B, a base station, a wireless access point (e.g., a Wi-Fi access point), a low power node, a base transceiver station (BTS), relay, donor node controlling relay, transmission points, transmission nodes, remote RF unit (RRU), remote radio head (RRH), multi-standard radio (MSR) radio node such as MSR BS, nodes in distributed antenna system (DAS), O&M, OSS, SON, positioning node (e.g., E-SMLC), MDT, or any other suitable network node. In certain embodiments, network node 115 may be a master eNodeB or a secondary eNodeB operating in a dual connectivity split bearer.

Network nodes 115 may be deployed throughout network 100 as a homogenous deployment, heterogeneous deployment, or mixed deployment. A homogeneous deployment may generally describe a deployment made up of the same (or similar) type of network nodes 115 and/or similar coverage and cell sizes and inter-site distances. A heterogeneous deployment may generally describe deployments using a variety of types of network nodes 115 having different cell sizes, transmit powers, capacities, and inter-site distances. For example, a heterogeneous deployment may include a plurality of low-power nodes placed throughout a macro-cell layout. Mixed deployments may include a mix of homogenous portions and heterogeneous portions.

Network node 115 may include one or more of transceiver 1010, processor 1020, memory 1030, and network interface 1040. In some embodiments, transceiver 1010 facilitates transmitting wireless signals to and receiving wireless signals from wireless device 110 (e.g., via an antenna), processor 1020 executes instructions to provide some or all of the functionality described above as being provided by a network node 115, memory 1030 stores the instructions executed by processor 1020, and network interface 1040 communicates signals to backend network components, such as a gateway, switch, router, Internet, Public Switched Telephone Network (PSTN), core network nodes 130, radio network controllers 120, etc.

Processor 1020 may include any suitable combination of hardware and software implemented in one or more modules to execute instructions and manipulate data to perform some or all of the described functions of network node 115. In some embodiments, processor 1020 may include, for example, one or more computers, one or more central processing units (CPUs), one or more microprocessors, one or more applications, and/or other logic.

Memory 1030 is generally operable to store instructions, such as a computer program, software, an application including one or more of logic, rules, algorithms, code, tables, etc. and/or other instructions capable of being executed by a processor. Examples of memory 1030 include computer memory (for example, Random Access Memory (RAM) or Read Only Memory (ROM)), mass storage media (for example, a hard disk), removable storage media (for example, a Compact Disk (CD) or a Digital Video Disk (DVD)), and/or or any other volatile or non-volatile, non-transitory computer-readable and/or computer-executable memory devices that store information.

In some embodiments, network interface 1040 is communicatively coupled to processor 1020 and may refer to any suitable device operable to receive input for network node 115, send output from network node 115, perform suitable processing of the input or output or both, communicate to other devices, or any combination of the preceding. Network interface 1040 may include appropriate hardware (e.g., port, modem, network interface card, etc.) and software, including protocol conversion and data processing capabilities, to communicate through a network.

In certain embodiments, network node 115 may include one or more modules. For example, network node 115 may include a communication module, a receiving module, a determining module, and any other suitable modules. In some embodiments, one or more of the communication module, receiving module, determining module, or any other suitable module may be implemented using one or more processors 1020 of FIG. 10.

In general, the communication module may perform the transmission functions of network node 115. The communication module may transmit messages to one or more of wireless devices 110. The communication module may include a transmitter and/or a transceiver, such as transceiver 1010. The communication module may include circuitry configured to wirelessly transmit messages and/or signals.

The receiving module may perform the receiving functions of network node 115. The receiving module may receive any suitable information from a wireless device. For example, the receiving module may receive a signal encoded with an RA code. The receiving module may include a receiver and/or a transceiver. The receiving module may include circuitry configured to wirelessly receive messages and/or signals. In particular embodiments, the receiving module may communicate received messages and/or signals to the determining module.

The determining module may perform the processing functions of network node 115. For example, the determining module may generate a parity-check matrix for decoding a transmission scheme, such as a transmission scheme using an RA code. The determining module may perform message-passing decoding using the generated parity-check matrix. The determining module may include or be included in processor 1020. The determining module may include analog and/or digital circuitry configured to perform any of the functions of the determining module and/or processor 1020. The functions of the determining module described above may, in certain embodiments, be performed in one or more distinct modules. In certain embodiments, the functions of two or more of the various modules may be combined into a single module.

Other embodiments of network node 115 may include additional components beyond those shown in FIG. 10 that may be responsible for providing certain aspects of the radio network node's functionality, including any of the functionality described above and/or any additional functionality (including any functionality necessary to support the solutions described above). The various different types of network nodes may include components having the same physical hardware but configured (e.g., via programming) to support different radio access technologies, or may represent partly or entirely different physical components.

Figure 11:
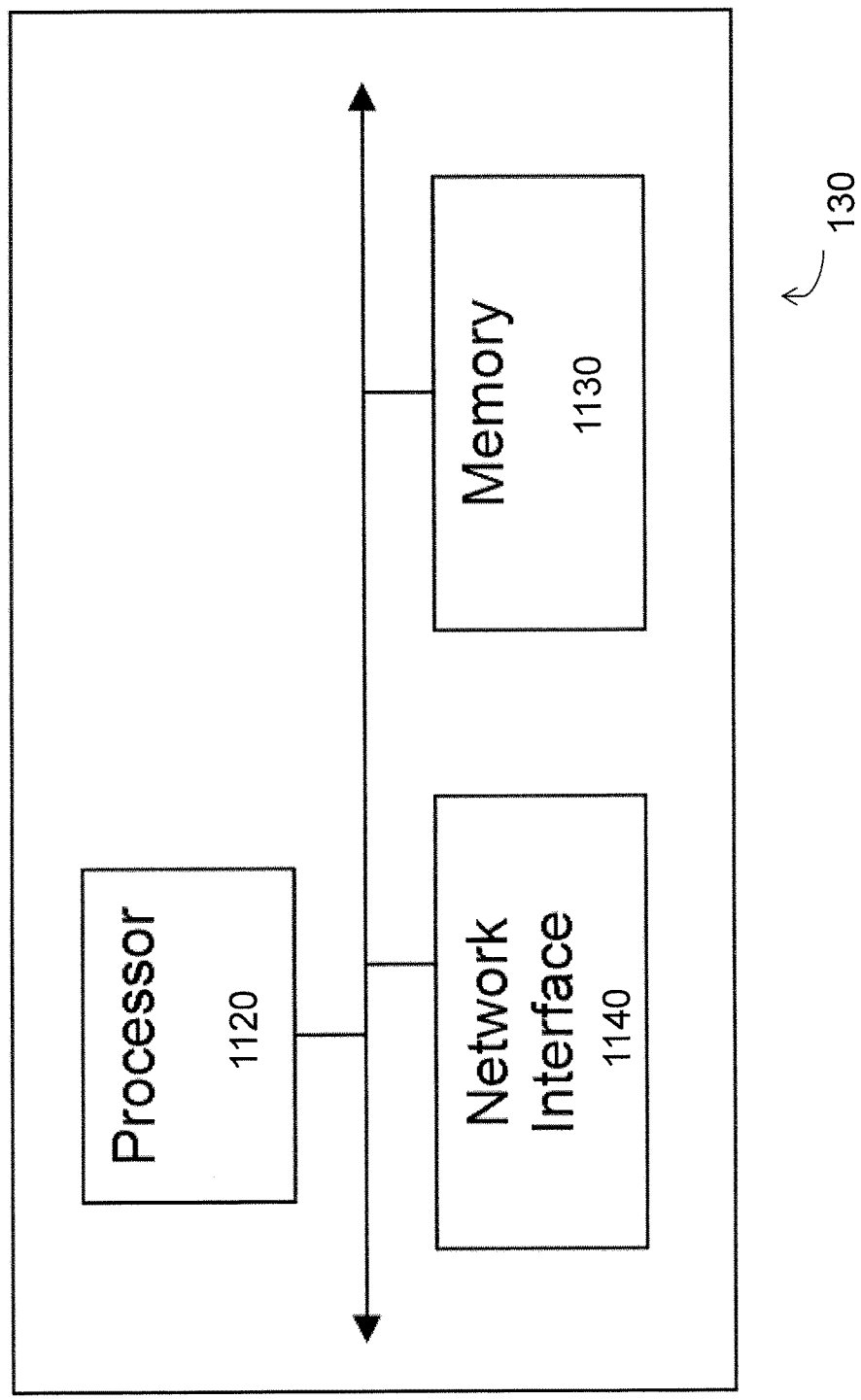
FIG. 11 is a block schematic of an exemplary radio network controller or core network node, in accordance with certain embodiments.

FIG. 11 is a block schematic of an exemplary radio network controller 120 or core network node 130, in accordance with certain embodiments. Examples of network nodes can include a mobile switching center (MSC), a serving GPRS support node (SGSN), a mobility management entity (MME), a radio network controller (RNC), a base station controller (BSC), and so on. The radio network controller 120 or core network node 130 include processor 1120, memory 1130, and network interface 1140. In some embodiments, processor 1120 executes instructions to provide some or all of the functionality described above as being provided by the network node, memory 1130 stores the instructions executed by processor 1120, and network interface 1140 communicates signals to any suitable node, such as a gateway, switch, router, Internet, Public Switched Telephone Network (PSTN), network nodes 115, radio network controllers 120, core network nodes 130, etc.

Processor 1120 may include any suitable combination of hardware and software implemented in one or more modules to execute instructions and manipulate data to perform some or all of the described functions of the radio network controller 120 or core network node 130. In some embodiments, processor 1320 may include, for example, one or more computers, one or more central processing units (CPUs), one or more microprocessors, one or more applications, and/or other logic.

Memory 1130 is generally operable to store instructions, such as a computer program, software, an application including one or more of logic, rules, algorithms, code, tables, etc. and/or other instructions capable of being executed by a processor. Examples of memory 1130 include computer memory (for example, Random Access Memory (RAM) or Read Only Memory (ROM)), mass storage media (for example, a hard disk), removable storage media (for example, a Compact Disk (CD) or a Digital Video Disk (DVD)), and/or any other volatile or non-volatile, non-transitory computer-readable and/or computer-executable memory devices that store information.

In some embodiments, network interface 1140 is communicatively coupled to processor 1120 and may refer to any suitable device operable to receive input for the network node, send output from the network node, perform suitable processing of the input or output or both, communicate to other devices, or any combination of the preceding. Network interface 1140 may include appropriate hardware (e.g., port, modem, network interface card, etc.) and software, including protocol conversion and data processing capabilities, to communicate through a network.

Other embodiments of the network node may include additional components beyond those shown in FIG. 11 that may be responsible for providing certain aspects of the network node's functionality, including any of the functionality described above and/or any additional functionality (including any functionality necessary to support the solution described above).

Modifications, additions, or omissions may be made to the systems and apparatuses disclosed herein without departing from the scope of the disclosure. The components of the systems and apparatuses may be integrated or separated. Moreover, the operations of the systems and apparatuses may be performed by more, fewer, or other components. Additionally, operations of the systems and apparatuses may be performed using any suitable logic comprising software, hardware, and/or other logic. As used in this document, "each" refers to each member of a set or each member of a subset of a set.

Modifications, additions, or omissions may be made to the methods disclosed herein without departing from the scope of the disclosure. The methods may include more, fewer, or other steps. Additionally, steps may be performed in any suitable order.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the following claims.

Abbreviations used in the preceding description include:
BLE Bluetooth Low Energy
GFSK Gaussian Frequency Shift Keying
CP-FSK Continuous-phase Frequency Shift Keying
GMSK Gaussian Minimum Shift Keying
D-BPSK Differential binary phase shift keying
FEC Forward error correcting
LLR Log-likelihood ratios
LDPC Low-density parity-check
RA Repeat-accumulate

The invention claimed is:

1. A method in a network node, comprising:
generating a parity-check matrix for decoding a received signal encoded with a transmission scheme, the transmission scheme comprising a repetition code, an interleaver, and a modulation having a memory property, the parity-check matrix comprising a function of:
a differentiator matrix, the differentiator matrix comprising an inverse of an accumulator matrix;
a deinterleaver matrix, the deinterleaver matrix comprising an inverse of an interleaver matrix, the interleaver matrix comprising a square unitary permutation matrix for introducing randomness; and
a repetition decoder matrix; and
performing message-passing decoding of the received signal using the generated parity-check matrix.

2. The method of claim 1, wherein the accumulator matrix is an upper triangular matrix having a diagonal and an upper triangle populated with ones and a lower triangle populated with zeroes.

3. The method of claim 1, wherein the transmission scheme further comprises a distributed pilot scheme having distributed pilot symbols between data sub-blocks.

4. The method of claim 3, wherein the accumulator matrix is defined to account for an interruption of accumulation due to the distributed pilot symbols between data sub-blocks, such that the accumulator matrix is a block diagonal matrix having non-zero block matrices in a diagonal and all-zero matrices off-diagonal, each block matrix in the diagonal comprising an upper triangular matrix.

5. The method of claim 4, wherein generating the parity-check matrix with the accumulator matrix defined to account for the interruption of accumulation due to the distributed pilot symbols results in a lower density of ones in the parity-check matrix relative to a parity-check matrix generated with an accumulator matrix not accounting for the distributed pilot symbols.

6. The method of claim 1, wherein the modulation comprises one of differential binary phase-shift keying (DBPSK), Gaussian frequency-shift keying (FSK), and Gaussian minimum shift keying.

7. The method of claim 1, wherein the modulation comprises a type of continuous-phase frequency-shift keying, and the method further comprises performing de-rotation to convert the modulation scheme to differential binary phase-shift keying.

8. The method of claim 1, wherein the transmission scheme comprises a repeat-accumulate code.

9. The method of claim 1, wherein the repetition code repeats each incoming bit according to a predetermined sequence pattern.

10. A method in a wireless device, comprising:
generating a parity-check matrix for decoding a received signal encoded with a transmission scheme, the transmission scheme comprising a repetition code, an interleaver, and a modulation having a memory property, the parity-check matrix comprising a function of:
a differentiator matrix, the differentiator matrix comprising an inverse of an accumulator matrix;
a deinterleaver matrix, the deinterleaver matrix comprising an inverse of an interleaver matrix, the interleaver matrix comprising a square unitary permutation matrix for introducing randomness; and
a repetition decoder matrix; and
performing message-passing decoding of the received signal using the generated parity-check matrix.

11. The method of claim 10, wherein the accumulator matrix is an upper triangular matrix having a diagonal and an upper triangle populated with ones and a lower triangle populated with zeroes.

12. The method of claim 10, wherein the transmission scheme further comprises a distributed pilot scheme having distributed pilot symbols between data sub-blocks.

13. The method of claim 12, wherein the accumulator matrix is defined to account for an interruption of accumulation due to the distributed pilot symbols between data sub-blocks, such that the accumulator matrix is a block diagonal matrix having non-zero block matrices in a diagonal and all-zero matrices off-diagonal, each block matrix in the diagonal comprising an upper triangular matrix.

14. The method of claim 13, wherein generating the parity-check matrix with the accumulator matrix defined to account for the interruption of accumulation due to the distributed pilot symbols results in a lower density of ones in the parity-check matrix relative to a parity-check matrix generated with an accumulator matrix not accounting for the distributed pilot symbols.

15. The method of claim 10, wherein the modulation comprises one of differential binary phase-shift keying (DBPSK), Gaussian frequency-shift keying (FSK), and Gaussian minimum shift keying.

16. The method of claim 10, wherein the modulation comprises a type of continuous-phase frequency-shift keying, and the method further comprises performing de-rotation to convert the modulation scheme to differential binary phase-shift keying.

17. The method of claim 10, wherein the transmission scheme comprises a repeat-accumulate code.

18. The method of claim 10, wherein the repetition code repeats each incoming bit according to a predetermined sequence pattern.

19. A network node, comprising:
one or more processors configured to:
generate a parity-check matrix for decoding a received signal encoded with a transmission scheme, the transmission scheme comprising a repetition code, an interleaver, and a modulation having a memory property, the parity-check matrix comprising a function of:
a differentiator matrix, the differentiator matrix comprising an inverse of an accumulator matrix;
a deinterleaver matrix, the deinterleaver matrix comprising an inverse of an interleaver matrix, the interleaver matrix comprising a square unitary permutation matrix for introducing randomness; and
a repetition decoder matrix; and
perform message-passing decoding of the received signal using the generated parity-check matrix.

20. The network node of claim 19, wherein the accumulator matrix is an upper triangular matrix having a diagonal and an upper triangle populated with ones and a lower triangle populated with zeroes.

21. The network node of claim 19, wherein the transmission scheme further comprises a distributed pilot scheme having distributed pilot symbols between data sub-blocks.

22. The network node of claim 21, wherein the accumulator matrix is defined to account for an interruption of accumulation due to the distributed pilot symbols between data sub-blocks, such that the accumulator matrix is a block diagonal matrix having non-zero block matrices in a diagonal and all-zero matrices off-diagonal, each block matrix in the diagonal comprising an upper triangular matrix.

23. The network node of claim 22, wherein the one or more processors configured to generate the parity-check matrix with the accumulator matrix defined to account for the interruption of accumulation due to the distributed pilot symbols results in a lower density of ones in the parity-check matrix relative to a parity-check matrix generated with an accumulator matrix not accounting for the distributed pilot symbols.

24. The network node of claim 19, wherein the modulation comprises one of differential binary phase-shift keying (DBPSK), Gaussian frequency-shift keying (FSK), and Gaussian minimum shift keying.

25. The network node of claim 19, wherein the modulation comprises a type of continuous-phase frequency-shift keying, and the one or more processors are further configured to perform de-rotation to convert the modulation scheme to differential binary phase-shift keying.

26. The network node of claim 19, wherein the transmission scheme comprises a repeat-accumulate code.

27. The network node of claim 19, wherein the repetition code repeats each incoming bit according to a predetermined sequence pattern.

28. A wireless device, comprising:
one or more processors configured to:
generate a parity-check matrix for decoding a received signal encoded with a transmission scheme, the transmission scheme comprising a repetition code, an interleaver, and a modulation having a memory property, the parity-check matrix comprising a function of:
a differentiator matrix, the differentiator matrix comprising an inverse of an accumulator matrix;
a deinterleaver matrix, the deinterleaver matrix comprising an inverse of an interleaver matrix, the interleaver matrix comprising a square unitary permutation matrix for introducing randomness; and
a repetition decoder matrix; and
perform message-passing decoding of the received signal using the generated parity-check matrix.

29. The wireless device of claim 28, wherein the accumulator matrix is an upper triangular matrix having a diagonal and an upper triangle populated with ones and a lower triangle populated with zeroes.

30. The wireless device of claim 28, wherein the transmission scheme further comprises a distributed pilot scheme having distributed pilot symbols between data sub-blocks.

31. The wireless device of claim 30, wherein the accumulator matrix is defined to account for an interruption of accumulation due to the distributed pilot symbols between data sub-blocks, such that the accumulator matrix is a block diagonal matrix having non-zero block matrices in a diagonal and all-zero matrices off-diagonal, each block matrix in the diagonal comprising an upper triangular matrix.

32. The wireless device of claim 31, wherein generating the parity-check matrix with the accumulator matrix defined to account for the interruption of accumulation due to the distributed pilot symbols results in a lower density of ones in the parity-check matrix relative to a parity-check matrix generated with an accumulator matrix not accounting for the distributed pilot symbols.

33. The wireless device of claim 28, wherein the modulation comprises one of differential binary phase-shift keying (DBPSK), Gaussian frequency-shift keying (FSK), and Gaussian minimum shift keying.

34. The wireless device of claim 28, wherein the modulation comprises a type of continuous-phase frequency-shift keying, and the method further comprises performing de-rotation to convert the modulation scheme to differential binary phase-shift keying.

35. The wireless device of claim 28, wherein the transmission scheme comprises a repeat-accumulate code.

36. The wireless device of claim 28, wherein the repetition code repeats each incoming bit according to a predetermined sequence pattern.

\* \* \* \* \*